United States Patent [19]

Bui et al.

[11] Patent Number: 4,797,178

[45] Date of Patent: Jan. 10, 1989

[54] PLASMA ETCH ENHANCEMENT WITH LARGE MASS INERT GAS

[75] Inventors: Vu Q. Bui, Endicott; Kevin K. Chan, Staten Island; Joseph G. Hoffarth, Binghamton, all of N.Y.; Vicki J. Malueg, Rochester, Minn.

[73] Assignee: International Business Machines Corporation, Armonk, N.Y.

[21] Appl. No.: 49,254

[22] Filed: May 13, 1987

[51] Int. Cl.$^4$ ............... B44C 1/22; C03C 15/00; C03C 25/06; B29C 37/00

[52] U.S. Cl. ................... 156/643; 134/1; 156/646; 156/655; 156/668; 204/192.36; 252/79.1

[58] Field of Search ............ 134/1; 156/643, 646, 156/655, 668; 204/192.36; 252/79.1

[56] References Cited

U.S. PATENT DOCUMENTS

| | | | |
|---|---|---|---|
| 4,472,238 | 9/1984 | Johnson | 156/643 |
| 4,601,782 | 7/1986 | Bianchi et al. | 156/643 |
| 4,654,115 | 3/1987 | Egitto et al. | 156/668 X |
| 4,689,111 | 8/1987 | Chan et al. | 252/79.1 X |
| 4,720,322 | 1/1988 | Tiffin | 204/192.36 |

OTHER PUBLICATIONS

"Optical Emission Spectroscopy of Reactive Plasmas: A Method of Correlating Emission Intensities to Reactive Particle Densities", J. W. Coburn et al, J. Appl. Phys. 51 (6), Jul. 1980.

*Primary Examiner*—William A. Powell
*Attorney, Agent, or Firm*—Elmer W. Galbi

[57] ABSTRACT

The present invention provides a process for plasma cleaning and an improved gas mixture for use in a plasma cleaning process. The gas mixture of the present invention includes the normal process gases such as oxygen and carbon tetrafluoride. However, the mixture also includes a small percentage of a large mass inert gas such as Argon or Krypton. This large mass gas molecule mechanically removes any polymerized fluorocarbon that forms on the surface being cleaned thereby significantly enhancing the rate of etch or cleaning.

It has been found that five to twenty percent of the inert gas is the preferred range and that ten percent produces optimum results.

9 Claims, No Drawings

PLASMA ETCH ENHANCEMENT WITH LARGE MASS INERT GAS

TECHNICAL FIELD

The present invention relates to the manufacture of printed circuit boards and more particularly to the removal of organic material from printed circuit boards using plasma gas.

BACKGROUND AND PRIOR ART

The use of plasma gas to etch material is well known. For example, see U.S. Pat. Nos. 4,028,155, 4,545,851, 4,370,195, 4,370,196 4,536,271, 4,357,203 4,314,875 and 4,426,246.

It is also well known that during the manufacture of printed circuit boards, organic material can be removed from drilled holes and from the surface of a printed circuit board using plasma gas techniques. Normally in such plasma processes a mixture of oxygen and carbon tetrafluoride is used as the process gas. It is known that the etch rate in such plasma systems depend on a variety of parameters such as the amount of RF power, the chamber pressure, the feed gas flow rate, the feed gas composition, etc.

It is also known that the etch rate of organic polymers, photoresists and semi-conductor materials can be increased by alternating pure oxygen plasma with a CF4/O2 mixture (disclosure EN8850106, application serial number 718,246, filed Apr. 1, 1985, abandoned). Furthermore, it has been found that fast etching can be achieved by using several pulses of pure oxygen gas in conjunction with a CF4/O2 plasma (see *RESEARCH DISCLOSURE*, October 1986, Number 270, page 27025).

One factor which inhibits the efficacy of plasma clean operations is that during the cleaning operation, a monolayer of polymerized fluorocarbon sometimes forms on the surface of the material being cleaned. This layer of polymerized fluorocarbon has teflon like properties and it inhibits further cleaning by the plasma.

Other prior art techniques (such as that shown in U.S. Pat. No. 4,522,681) use a carrier gas along with the process gases. The process gases are gases such as oxygen and carbon tetrafluoride. The carrier gases are inert gases such as Helium and Argon. In such prior art the percentage of inert gas used is relatively high; that is, the percentage of inert gas is generally above thirty percent. Furthermore, since the inert gas is only used as a carrier, either a low mass gas such as Helium or a high mass gas such as Argon can be used.

OBJECTS OF THE INVENTION

An object of the present invention is to provide an improved process for cleaning printed circuit boards.

Another object is to provide an improved process for etching an organic material.

Yet another object of the present invention is to provide a plasma cleaning system which removes any polymerized fluorocarbon on the surface of the material being cleaned.

Another object of the present invention is to provide a plasma cleaning operation which removes any material which interferes with the adhesion of later applied catalyst or seeders.

Still another object of the present invention is to provide an improved mixture of fluorine containing gases for use in a plasma cleaning operation.

A still further object of the present invention is to provide an optimum mixture of gases for use in a plasma clean operation.

SUMMARY OF THE INVENTION

The present invention provides a process for plasma cleaning and an improved gas mixture for use in a plasma cleaning process. The gas mixture of the present invention includes the normal process gases such as oxygen and carbon tetrafluoride. However, the mixture also includes a small percentage of a large mass inert gas such as Argon or Krypton. This large mass gas molecule mechanically removes any polymerized fluorocarbon that forms on the surface being cleaned thereby significantly enhancing the rate of etch or cleaning.

It has been found that five to twenty percent of the inert gas is the preferred range and that ten percent produces optimum results.

DETAILED DESCRIPTION

The plasma etch process of the present invention can be practiced in commercially available parallel plate reactors such as those marketed by Branson Corporation and Advanced Plasma Systems Inc.

In practicing the present invention, the specimens to be etched or cleaned are placed on racks between the electrodes. The gas mixture of the invention is introduced into the reactor and RF power is applied to the plates of the reactor. A power density of about 0.1 to 1.0 (watts per square centimeter) of electrode area is used. The RF frequency can be in the range of about 15 kilohertz to 13.5 megahertz.

The material being etched or cleaned is subjected to the plasma for about 20 to 30 minutes at a power of about 3000 to 4000 watts and a gas flow rate of about 2000 to 3000 standard cubic centimeters per minute (sccm). In a reactor such as the one manufactured by Advanced Plasma Systems which has two gas inlets, a cycle time between inlets of one minute is used.

It has been found that by including about five to twenty percent (on a volume basis) of an inert gas having a large mass such as Argon or Krypton, the etch rate is significantly increased. The reason for this is that the large molecules of the inert gas will in effect physically remove any polymerized fluorocarbon that forms on the surface that is being etched or cleaned. It is believed that the large mass inert gas influences the surface chemistry and resultant etch rate due to the sputtering effect of the large mass inert gas ions. Thus, for a given polymer, the optimum etch rate occurs when the sputtered ions reduce the surface fluorination but do not result in carbonation of the polymer surface. It is noted that a normal plasma such as CF4/O2 does not attack or affect a polymerized fluorocarbon surface. While use of about five to twenty percent of a large mass inert gas is the preferred range, optimum performance can be obtained by using about ten percent by volume of the inert gas. While Argon and Krypton are the preferred large mass gases, it is noted that Argon is less expensive and that other large mass gases could be used.

The following specific examples further illustrate the invention, it being understood that the invention is in no way intended to be limited to the details in these examples. Each of these examples was done in a commercially available parallel plate reactor of the type marketed by Advanced Plasma System, model number 2400:

EXAMPLE 1

Pressure 300 microns
Power 4000 watts
Flow rate 3000sccm
Gas cycle 1 minute
Process Time 20 minutes
CF4/ O2 ratio 60/40

EXAMPLE 1a

| Argon Concentration | Weight Loss |
| --- | --- |
| 0 percent | 0.62E-4 grams per square cm. |

EXAMPLE 1b

| Argon Concentration | Weight Loss |
| --- | --- |
| 5 percent | 0.84E-4 grams per square cm. |

EXAMPLE 1c

| Argon Concentration | Weight Loss |
| --- | --- |
| 10 percent | 1.17E-4 grams per square cm. |

EXAMPLE 1d

| Argon Concentration | Weight Loss |
| --- | --- |
| 15 percent | 1.10E-4 grams per square cm. |

EXAMPLE 1e

| Argon Concentration | Weight Loss |
| --- | --- |
| 20 percent | 1.02E-4 grams per square cm. |

EXAMPLE 2

Pressure 300 microns
Power 4000 watts
Flow rate 3000 sccm
Gas cycle 1 minute
Process Time 30 minutes
CF4/ O2 ratio 60/40

EXAMPLE 2a

| Argon Concentration | Weight Loss |
| --- | --- |
| 0 percent | 0.7E-4 grams per square cm. |

EXAMPLE 2b

| Argon Concentration | Weight Loss |
| --- | --- |
| 5 percent | 0.92E-4 grams per square cm. |

EXAMPLE 2c

| Argon Concentration | Weight Loss |
| --- | --- |
| 10 percent | 2.43E-4 grams per square cm. |

EXAMPLE 2d

| Argon Concentration | Weight Loss |
| --- | --- |
| 15 percent | 2.21E-4 grams per square cm. |

EXAMPLE 2e

| Argon Concentration | Weight Loss |
| --- | --- |
| 20 percent | 2.10E-4 grams per square cm. |

EXAMPLE 3

Pressure 300 microns
Power 4000 watts
Flow rate 2000 sccm
Gas cycle 1 minute
Process Time 30 minutes
CF4/ O2 ratio 60/40

EXAMPLE 3a

| Argon Concentration | Weight Loss |
| --- | --- |
| 0 percent | 0.57E-4 grams per square cm. |

EXAMPLE 3b

| Argon Concentration | Weight Loss |
| --- | --- |
| 5 percent | 0.79E-4 grams per square cm. |

EXAMPLE 3c

| Argon Concentration | Weight Loss |
| --- | --- |
| 10 percent | 1.27E-4 grams per square cm. |

EXAMPLE 3d

| Argon Concentration | Weight Loss |
| --- | --- |
| 15 percent | 1.10E-4 grams per square cm. |

EXAMPLE 3e

| Argon Concentration | Weiqht Loss |
| --- | --- |
| 20 percent | 1.04E-4 grams per square cm. |

While preferred embodiments of the invention have been described above, many modifications can be made thereto without departing from its spirit and scope. Accordingly, the invention is not limited by the forego-

I claim:

1. A gas mixture for plasma cleaning comprising
a process gas including carbon tetrafluoride and oxygen in the ratio of about 60/40,
a large mass inert gas in the amount of about five to twenty percent by volume,
whereby the action of said process gas is not inhibited by any polymerized fluorocarbons that form on said surface.

2. The gas recited in claim 1 wherein said large mass inert gas comprises the class that includes Argon and Krypton.

3. A method of plasma cleaning a surface comprising,
subjecting said surface to a plasma process gas which includes carbon tetrafluoride and oxygen,
whereby non-polymerized organics are removed and polymerized fluorocarbons are formed on said surface,
simultaneously subjecting said surface to bombardment by a large mass inert gas, whereby said polymerized fluorocarbons are removed,
thereby enhancing the action of process gas.

4. The method recited in claim 3 wherein said large mass inert gas comprises the class that includes Argon and Krypton.

5. The method of plasma cleaning a surface comprising,
subjecting said surface to a plasma process gas which removes non polymerized organics from said surface,
simultaneously subjecting said surface to bombardment by a large mass inert gas, in sufficient amount to remove polymerized fluorocarbons without carbonizing said surface,
whereby the action of said process gas is enhanced by the action of said large mass inert gas.

6. The method recited in claim 5 wherein said large mass inert gas comprises the class that includes Argon and Krypton.

7. The method recited in claim 5 wherein said process gas includes oxygen and carbon tetrafluoride.

8. The method recited in claim 5 wherein said surface includes a printed circuit board.

9. A gas mixture for plasma cleaning comprising
a process gas including carbon tetrafluoride and oxygen,
a large mass inert gas in the amount of about ten percent by volume,
whereby the action of said process gas is not inhibited by any polymerized fluorocarbons that form on said surface.

* * * * *